(12) United States Patent
Coons et al.

(10) Patent No.: US 12,135,460 B2
(45) Date of Patent: Nov. 5, 2024

(54) STACKABLE PHOTONICS DIE WITH DIRECT OPTICAL INTERCONNECT

(71) Applicant: Intel Corporation, Santa Clara, CA (US)

(72) Inventors: Todd R. Coons, Hillsboro, OR (US); Michael Rutigliano, Hillsboro, OR (US); Joe F. Walczyk, Tigard, OR (US); Abram M. Detofsky, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 774 days.

(21) Appl. No.: 17/132,912

(22) Filed: Dec. 23, 2020

(65) Prior Publication Data
US 2022/0196915 A1    Jun. 23, 2022

(51) Int. Cl.
*G02B 6/42* (2006.01)
*G02B 6/12* (2006.01)
*G02B 6/30* (2006.01)
*G02B 6/34* (2006.01)
*H01L 25/075* (2006.01)
*H01L 33/58* (2010.01)
*H01L 33/62* (2010.01)
*H01L 23/367* (2006.01)
*H04B 10/40* (2013.01)

(52) U.S. Cl.
CPC ............ *G02B 6/4201* (2013.01); *G02B 6/34* (2013.01); *H01L 25/0756* (2013.01); *H01L 33/62* (2013.01); *G02B 6/12019* (2013.01); *G02B 6/30* (2013.01); *H01L 23/367* (2013.01); *H01L 33/58* (2013.01); *H04B 10/40* (2013.01)

(58) Field of Classification Search
CPC ........ G02B 6/12019; G02B 6/30; G02B 6/34; G02B 6/4201; G02B 6/4204; G02B 6/12004; H01L 25/0756; H01L 20/16; H01L 20/167; H01L 33/58; H01L 33/62; H01L 23/367; H01L 23/481; H01L 24/02; H01L 24/10; H04B 10/40
See application file for complete search history.

(56) References Cited

U.S. PATENT DOCUMENTS

2013/0308898 A1    11/2013  Doerr
2019/0243064 A1*   8/2019   Menezo ................. G02B 6/136
(Continued)

OTHER PUBLICATIONS

Search Report for European Patent Application No. 21196009.1, mailed Feb. 18, 2022, 8 pgs.

*Primary Examiner* — Michael P Mooney
(74) *Attorney, Agent, or Firm* — Schwabe, Williamson & Wyatt, P.C.

(57) ABSTRACT

Embodiments described herein may be related to apparatuses, processes, and techniques related to incorporating photonics integrated circuitry into a base die, the base die including an optical interconnect at a bottom of the base die to transmit and to receive light signals from outside the base die. The top of the base die includes one or more electrical connectors that are electrically coupled with the photonics integrated circuitry. The base die may be referred to as the photonics die. A system-on-a-chip (SOC) may be electrically coupled with and stacked onto the top of the photonics die. Other embodiments may be described and/or claimed.

22 Claims, 10 Drawing Sheets

(56) References Cited

U.S. PATENT DOCUMENTS

| | | | |
|---|---|---|---|
| 2020/0081314 A1* | 3/2020 | Parvizi | G02F 1/2255 |
| 2020/0271860 A1* | 8/2020 | Chen | G02B 6/43 |
| 2020/0355880 A1* | 11/2020 | Wright | G02B 6/43 |
| 2020/0365544 A1* | 11/2020 | Chen | H01L 25/18 |

* cited by examiner

STACKABLE PHOTONICS DIE WITH DIRECT OPTICAL INTERCONNECT

FIELD

Embodiments of the present disclosure generally relate to the field of photonics packaging, and in particular to photonics dies with an optical interface on a bottom side of the die.

BACKGROUND

Continued growth in virtual machines and cloud computing will increase the demand for reliable manufactured semiconductor packages, including optical packages.

DETAILED DESCRIPTION

Figure 1:
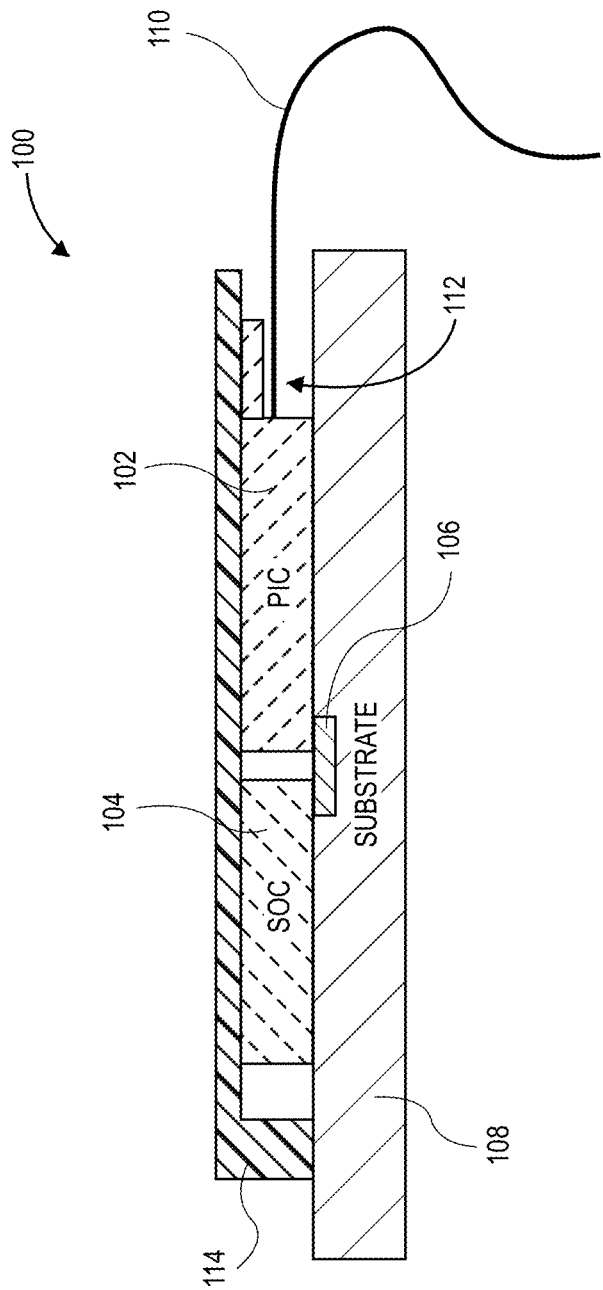
FIG. 1 shows a diagram of a legacy implementation of a photonics package that includes a photonics integrated circuit with optical coupler electrically coupled with a system-on-a-chip (SOC).

Embodiments described herein may be related to apparatuses, processes, systems, and techniques related to incorporating photonics integrated circuitry into a base die, the base die including an optical interconnect at a bottom of the base die to transmit and to receive light signals from outside the base die. The top of the base die includes one or more electrical connectors that are electrically coupled with the photonics integrated circuitry. In embodiments, the base die may be referred to as a photonics die. In embodiments, a system-on-a-chip (SOC) may be electrically coupled with and stacked onto the top of the photonics die and to electrically couple with the photonics die.

In legacy implementations, the SOC and the photonics die are electrically coupled using an interconnect bridge, such as an embedded multi-die interconnect bridge (EMIB), or a silicon interposer, organic routing on substrate or a redistribution layer (RDL) on a substrate. These implementations typically result in an optical coupling with the photonics die that is positioned either vertically or horizontally at the top of the package. One challenge of these legacy interconnect bridge implementations is that they create a complicated packaging system, including complex alignment with an interconnect bridge die. Another disadvantage is that the photonics optical connection is typically at the top of the package, which complicates the thermal solution and the socket loading mechanism. When a photonics optical connection (or plug) exits on the top surface of the package, it is in a very congested region. The top of the package typically has thermal cooling features pressed down against the package and there is little room for anything in that region. It is more of a challenge to fit the connectors and the thermal solution in the same space. Another disadvantage is that legacy implementations with integrated plugs, or pigtail connectors, complicates package assembly and test. Packages with integrated plugs help with the space routing issues described above, but the integrated plugs dangle down and increase the overall package size and complexity. Pigtails and their connectors make test more complicated because they have to be constrained or positioned to make room on the test board.

Stacking the SOC and the photonics die may result in the photonics package taking up less XY space, providing better power delivery and performance by using lower power input output (I/O) connections through die stacking. In addition, stacking the SOC and the photonics die may result in shorter electrical reaches that are less electrically lossy and also less electrically noisy. In addition, embodiments provide a more mechanically robust and compact photonics package. In addition, embodiments provide a minimum number of interconnects between the SOC and the fiber-optic cables.

In embodiments, the photonics die having the optical interconnect at the bottom of the die may also result in better optical routing. For example, with legacy implementations, fiber couples with the top or side of a legacy photonics die. When the legacy photonics die is coupled with a motherboard requiring an optical pathway to couple with a bottom of the motherboard, optical fiber is needed to route from the top or side of the legacy photonics die, around the edge of the motherboard, and to the bottom of the motherboard.

In contrast, with embodiments described herein having the optical interconnect at the bottom of the photonics die, the light signals can go from the optical interconnect of the photonics die straight down through the motherboard to the bottom of the motherboard for optical connection. In embodiments, the optical interconnect may include a grating coupler, a lens array, or an orthogonal optical connector. In embodiments, the optical interconnect may be optically coupled and directly physically coupled with optical fiber cables to direct the optical signal outside of the photonics die.

Embodiments of this die stacking structure with an optical interconnect at the bottom of the photonics die may result in a direct connection between an SOC and the photonics connections to other devices. Manufacturing costs and package sizes may be reduced, in addition, this stacked structure may facilitate automated manufacturing as well as customer system assembly on site.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 shows a diagram of a legacy implementation of a photonics package that includes a photonics integrated circuit with optical coupler electrically coupled with a SOC. Legacy photonics package 100 shows a legacy photonics integrated circuit (PIC) 102 that is coupled with an SOC 104 through an interconnect bridge 106. The SOC 104, legacy PIC 102, and interconnect bridge 106 may be physically and/or electrically coupled to the substrate 108.

In legacy implementations, the interconnect bridge 106 may be an EMIB, a silicon interposer, organic routing on substrate 108 or a RDL on substrate 108, or some other electrical coupling. The configuration of the SOC 104 and the legacy PIC 102 may be referred to as a coplanar dies configuration. In legacy implementations, the legacy PIC 102 may optically couple with an optical fiber 110. In embodiments, portions of the optical fiber 110 may fit within the grooves 112 that are located on the legacy PIC 102. In other legacy implementations (not shown) the optical fiber 110 may couple with the legacy PIC 102 at a top of the PIC 102. In embodiments, the optical fiber 110 may include multiple optical fibers or other fiber related components.

In legacy implementations, a heatsink 114 may be physically and/or thermally coupled with the substrate 108, and may be also physically and/or thermally coupled with SOC 104 and legacy PIC 102. In other implementations, the bottom of the substrate 108 may be coupled with a motherboard (not shown) to which the optical fiber 110 may optically couple.

Figure 2:
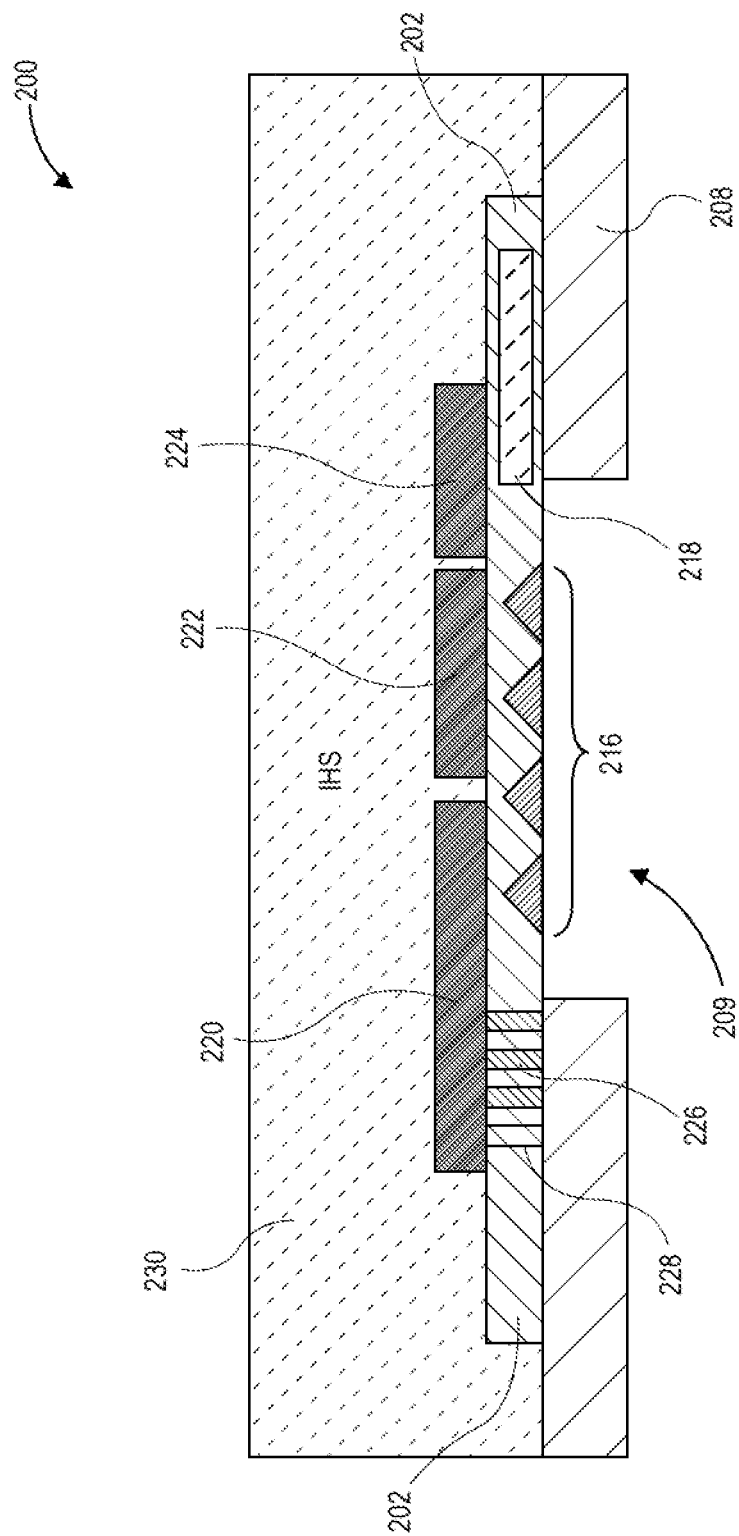
FIG. 2 shows a diagram of a photonics die with an optical interconnect on the bottom side of the die and electrical connectors at a top side of the die, in accordance with various embodiments.

FIG. 2 shows a diagram of a photonics die with an optical interconnect on the bottom side of the die and electrical connectors at a top side of the die, in accordance with various embodiments. Photonics package 200 includes a substrate 208, which may be similar to substrate 108 of FIG. 1. A photonics die 202 may be physically and/or electrically coupled with the substrate 208. The photonics die 202 may include an optical interconnect 216 at a bottom side of the photonics die 202. In embodiments, the optical interconnect 216 may transmit or receive light signals in a direction perpendicular with the bottom side of the photonics die 202. In other embodiments, the optical interconnect 216 may transmit or receive light signals in other directions with respect to the bottom side of the photonics die 202. In embodiments, the optical interconnect 216 may include a grating coupler, a lens array, or an orthogonal optical connector.

In embodiments, the photonics die 202 may also include photonics integrated circuitry 218 (PIC) that is optically coupled with the optical interconnect 216. In embodiments, a top side of the photonics die 202 may include electrical connections (not shown) to electrically couple with one or more dies 220, 222, 224, one of which may be a SOC. In embodiments, the PIC 218 may be electrically coupled with the one or more dies 220, 222, 224. In embodiments, the dies 220, 222, 224 may be an XPU, a central processing unit (CPU), a graphics processing unit (GPU), a field programmable gate array (FPGA), an application specific integrated circuit (ASIC), or an accelerator chip. In embodiments, one of the dies 220, 222, 224 may be an external light engine that is optically coupled with the PIC 218 and/or the optical interconnect 216 within the photonics die 202.

In embodiments, the photonics die 202 may include one or more copper pillars 226 to provide power or provide electrical signal communication between the substrate 208 and the die 220. In embodiments, through silicon vias (TSV) 228 may be used to provide electrical signal communication between the substrate 208 and the die 220. TSV 228 may also provide power, a ground, or a connection for low-speed signals.

In embodiments, a heat spreader 230 may be thermally and/or physically coupled with the substrate 208, the photonics die 202, and/or the dies 220, 222, 224. In embodiments, the substrate 208 may include a substrate opening 209 through the substrate 208 to allow light to be transmitted between the optical interconnect 216 and a location outside the photonics package 200. In embodiments described further below, the substrate opening 209 may allow an external optical connector to couple with the optical interconnect 216. In embodiments, the positioning of the optical interconnect 216 at the bottom side of the photonics die 202 may have an additional advantage of providing physical clearance for the thermal system, including the heat spreader 230, of the photonics package 200.

Figure 3:
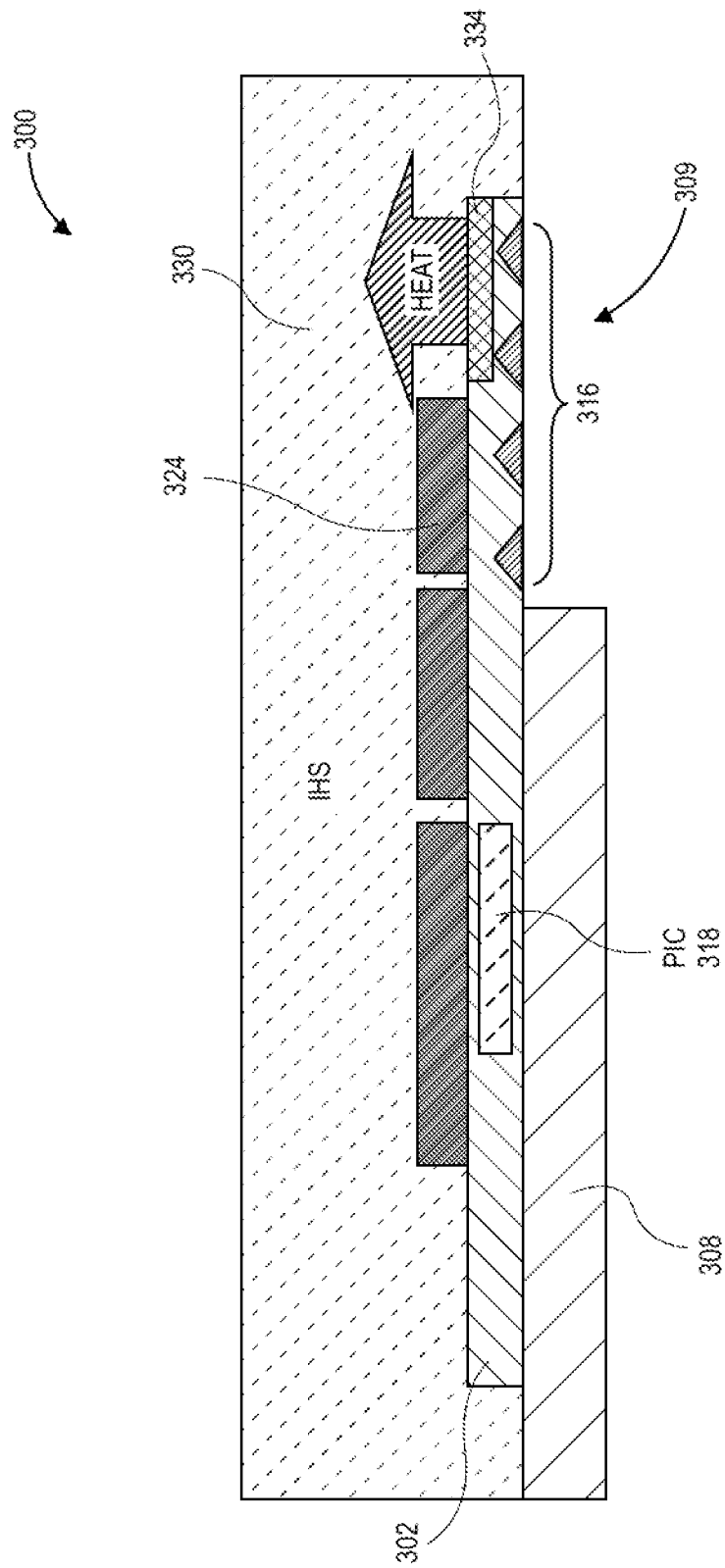
FIG. 3 shows a diagram of a photonics die with an optical interconnect on the bottom side of the die and a light engine at a top side of the die, in accordance with various embodiments.

FIG. 3 shows a diagram of a photonics die with an optical interconnect on the bottom side of the die and a light engine at a top side of the die, in accordance with various embodiments. Photonics package 300, which may be similar to photonics package 200 of FIG. 2, shows a different embodiment of the photonics die 302, which may be similar to photonics die 202 of FIG. 2. Here, the PIC 318, which may be similar to PIC 218 of FIG. 2, is positioned in a different location within the photonics die 302. The optical interconnect 316, which may be similar to optical interconnect 216 of FIG. 2, is positioned toward an end of the photonics die 302. The optical interconnect, and the PIC 318 are optically coupled.

A light engine 334 may be included within the photonics die 302. In embodiments, the light engine 334 generates light using, for example, a laser, a laser source array, or a light-emitting diode (LED). The light engine 334 may be optically coupled with the optical interconnect 316 and/or with the PIC 318. In embodiments, the heat spreader 330, which may be similar to heat spreader 230 of FIG. 2, may be thermally coupled with the light engine 334. In embodiments, the light engine 334 may generate significant heat during operation. In other embodiments (not shown) the light engine 334 may be placed within the PIC 318. In other embodiments (not shown) light used by the photonics die 302 may come from a source outside the photonics die 302, for example from a light engine in die 324, similar to die 224 of FIG. 2, that may be optically coupled with the photonics die 302.

In embodiments, substrate opening 309 in substrate 308, which may be similar to substrate opening 209 in substrate 208 of FIG. 2, will allow light to be transmitted between the optical interconnect 316 and outside the photonics package 300. In embodiments described further below, the substrate opening 309 may allow an external optical connector to couple with the optical interconnect 316.

Figure 4:
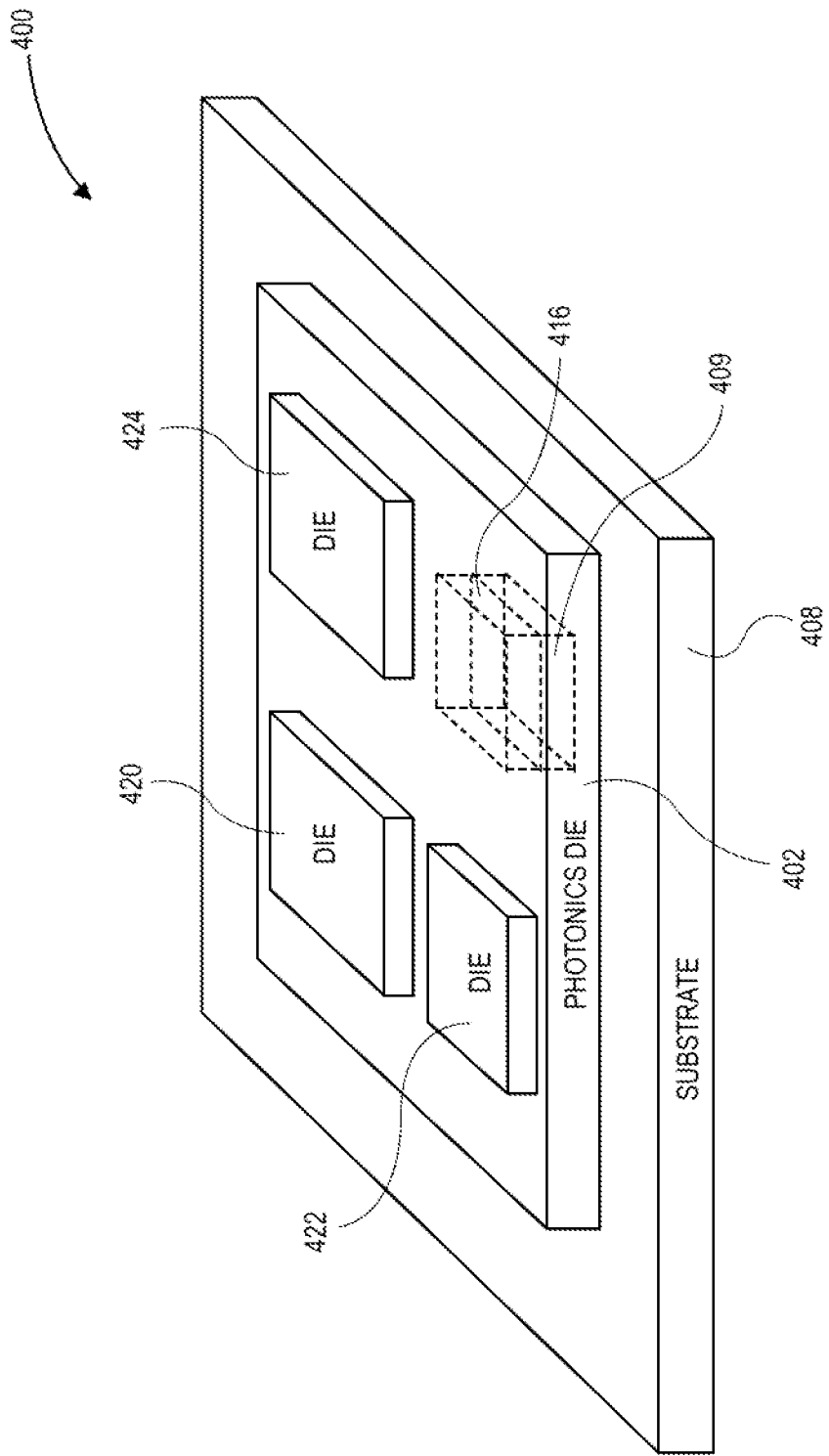
FIG. 4 shows a perspective diagram of a photonics die on a substrate with one or more dies coupled with a top of the photonics die and an optical coupler at a bottom side of the photonics die, in accordance with various embodiments.

FIG. 4 shows a perspective diagram of a photonics die on a substrate with one or more dies coupled with a top of the photonics die and an optical coupler at a bottom side of the photonics die, in accordance with various embodiments. Photonics package 400 may be similar to photonics package 300 of FIG. 3. Photonics package 400 may include a substrate 408 and a photonics die 402. A bottom of the photonics die 402 is electrically and/or physically coupled with the substrate 408, and one or more dies 420, 422, 424 are electrically coupled with a top of the photonics die 402. These may be similar to substrate 208, photonics die 202, and dies 220, 222, 224 of FIG. 2.

Optical interconnect 416, which may be similar to optical interconnect 216 of FIG. 2, is positioned within photonics die 402. Substrate opening 409 within substrate 408, which may be similar to substrate opening 209 within substrate 208 of FIG. 2, provides an optical pathway between the optical interconnect 416, and a location outside the photonics package 400. In embodiments, an external optical coupler may be inserted into substrate opening 409 to physically and/or optically couple with the optical interconnect 416.

As shown, the dies 420, 422, 424 may be positioned anywhere within an XY plane of the top surface of the photonics die 402. In embodiments, the dies 420, 422, 424 may be positioned with respect to their electrical conductivity with a PIC (not shown, but may be similar to PIC 218 of FIG. 2) within the photonics die 402, their thermal requirements, for example being placed away from a thermal hotspot (not shown) in the photonics die 402. In embodiments, one of the dies 424 may be a light engine, similar to light engine 334 of FIG. 3, that is disposed on the top of the photonics die 402 and optically coupled with the optical interconnect 416 and/or the PIC (not shown) within the photonics die 402.

In embodiments, a heat spreader (not shown, but may be similar to heat spreader 230 of FIG. 2), may thermally and/or physically couple part or all of the areas of the surface of the substrate 408, the photonics die 402, and/or the dies 420, 422, 424 to route heat away from thermal hotspots within the photonics package 400 during operation.

Figure 5:
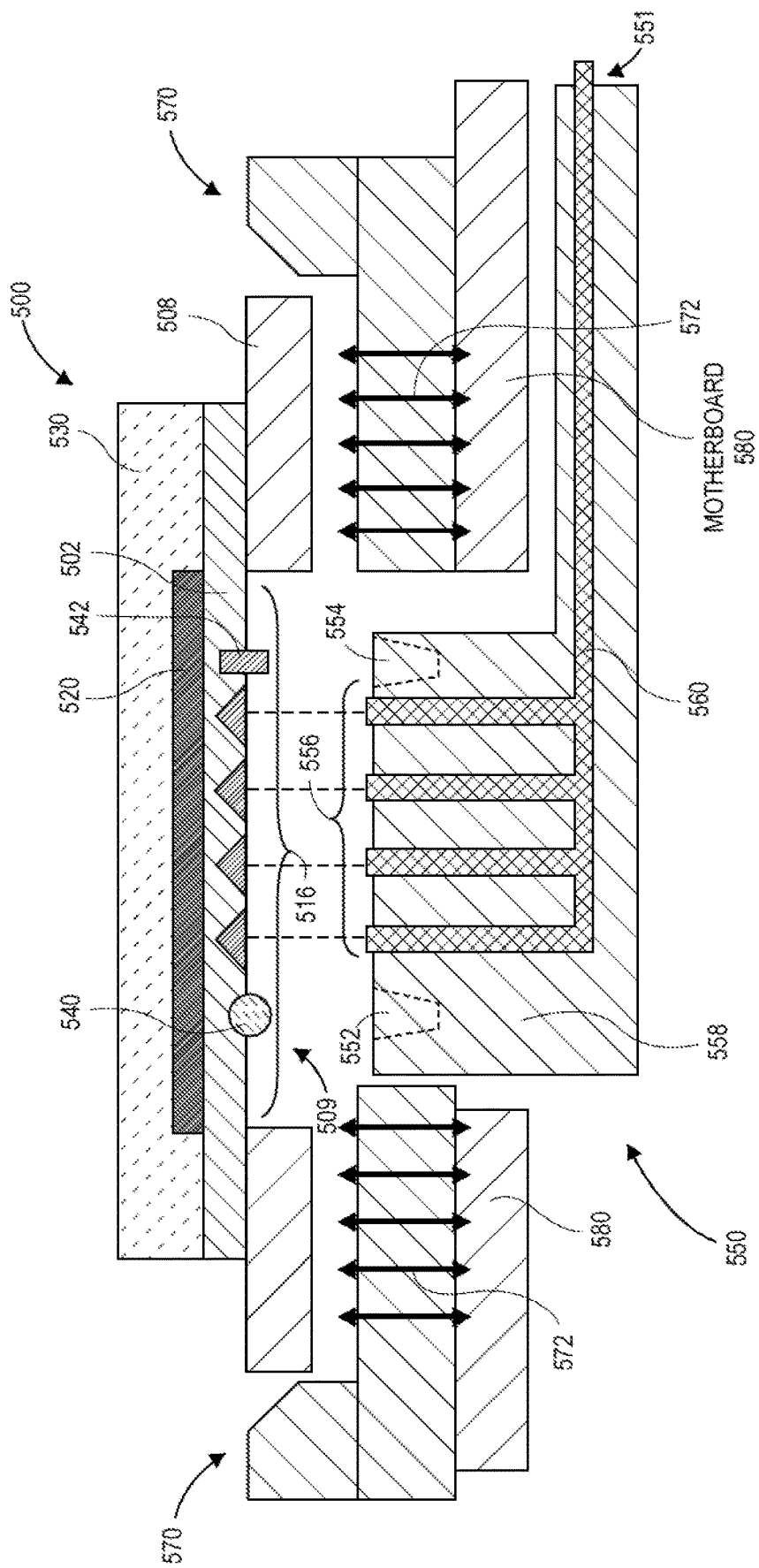
FIG. 5 shows a diagram of a photonics die package to be seated in a socket with an optical connector to be optically coupled with the optical coupler at the bottom side of the photonics die, in accordance with various embodiments.

FIG. 5 shows a diagram of a photonics die package to be seated in a socket with an optical connector to be optically coupled with the optical coupler at the bottom side of the photonics die, in accordance with various embodiments. FIG. 5 shows a photonics package 500, which may be similar to photonics package 400 of FIG. 4. A portion of the bottom side of photonics die 502 may be coupled with a top side of substrate 508, which may be similar to photonics die 302 and substrate 308 of FIG. 3. Optical interconnect 516, which may be similar to optical interconnect 316 of FIG. 3, may be disposed at the bottom side of optical die 502, and may be proximate to the substrate opening 509, which may be similar to substrate opening 309 of FIG. 3. Die 520, which may be similar to die 320 of FIG. 3, may be electrically coupled to the top surface of the photonics die 502. In embodiments, heat spreader 530, which may be similar to heat spreader 330 of FIG. 3, may be thermally coupled with the die 520 and the photonics die 502.

Alignment features 540, 542, may be physically coupled within the optical interconnect 516. In embodiments, alignment feature 540 may be a solder ball that is deposited on the bottom side of the photonics die 502. In embodiments, alignment feature 542 may be a copper pillar attached to or grown on the bottom side of the photonics die 502. In embodiments the alignment features 540, 542 may fit into alignment features 552 and 554 of external optical coupler 550. In embodiments, when the external optical coupler 550 is physically and optically coupled with the optical interconnect 516, the alignment feature 540 is to insert into alignment feature 552, and alignment feature 542 is to insert into alignment feature 554.

These alignment features may be designed such that, after physical coupling, they accurately align the optical pathways 556 of the external optical coupler 550 with the optical connections within the optical interconnect 516. In embodiments, these alignment features 540, 542, 552 and 554 may take a number of different forms and may include copper pillars, solder balls, V-grooves, or other physical alignment features that may be coupled to or removed from the supporting structure 558 of external optical coupler 550. In embodiments, the optical pathways 556 may couple with another optical path 560 to a side 551 of the external optical coupler 550. In embodiments, these optical paths may be optical fibers, waveguides, or open-air channels to conduct light signals.

In embodiments, the photonics package 500 may physically couple with a socket 570. In embodiments the socket 570 may include one or more pins 572 that may be used to electrically and physically couple the substrate 508 of the photonics package 500 to the socket 570. As shown, the socket 570 is connected to a motherboard 580. In embodiments, the external coupler 550 may also be coupled to a top of the motherboard 580 (not shown). In embodiments, there may be a spring (not shown) beneath the external optical coupler 550 and a top of the motherboard 580 to apply mechanical pressure to optically secure the optical pathways 556 of the external optical coupler 550 to the optical interconnect 516 of the optical package 500. In embodiments, as this mechanical pressure is applied, the alignment features 540, 542, 552 and 554 may assure a good alignment for a high quality optical connection.

Figure 6:
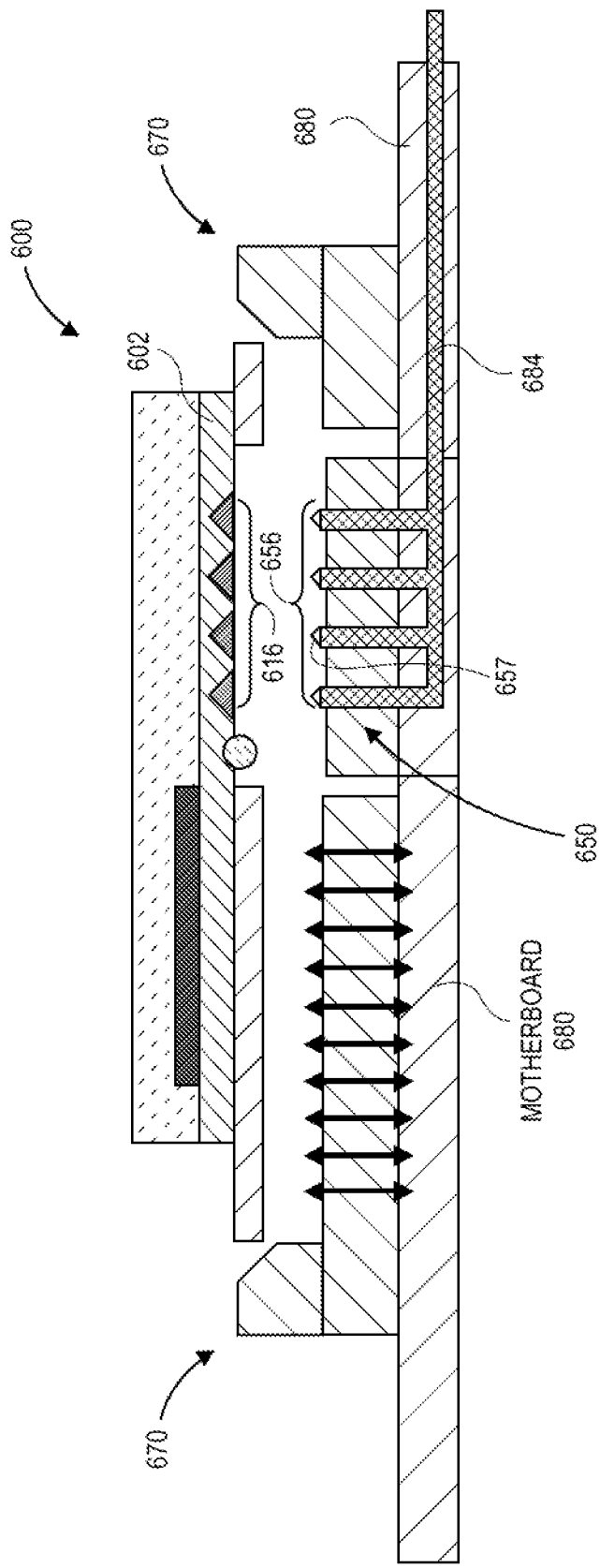
FIG. 6 shows a diagram of a photonics die package with an optical connector to be optically coupled with the optical coupler and with an optical pathway through a motherboard, in accordance with various embodiments.

FIG. 6 shows a diagram of a photonics die package with an optical connector to be optically coupled with the optical coupler and with an optical pathway through a motherboard, in accordance with various embodiments. Photonics package 600 may be similar to photonics package 500 of FIG. 5, socket 670 may be similar to socket 570 of FIG. 5, and external optical coupler 650 may be similar to external optical coupler 550 of FIG. 5.

In this embodiment, the external optical coupler 650 is optically and physically coupled with the motherboard 680, which may be similar to motherboard 580 of FIG. 5. In embodiments, the optical pathways 656 of external optical coupler 650, which may be similar to the optical pathways 556 of the external optical coupler 550 of FIG. 5, may be optically coupled to optical pathway 684. In embodiments, optical pathway 684 may be part of an optical layer of the motherboard 680.

In embodiments, the optical pathways 656 may include optical features 657 at the end of the optical pathways 656 proximate to the optical interconnect 616, which may be similar to optical interconnect 516 of FIG. 5. These optical features 657 may facilitate the face-to-face optical coupling with the optical interconnect 616. In other embodiments, the optical features 657 may be lenses that may be used to transmit and receive light, respectively, from each of the corresponding lenses of optical interconnect 616.

Figure 7:
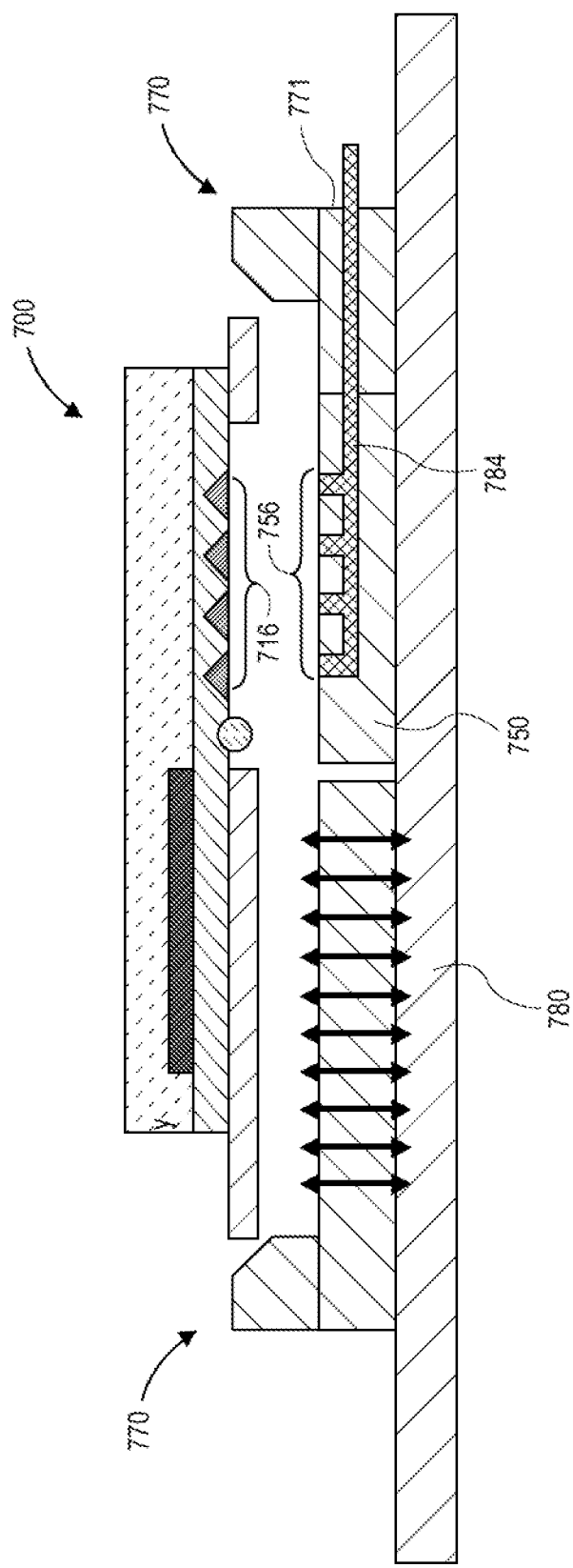
FIG. 7 shows a diagram of a photonics die package with an optical connector to be optically coupled with the optical coupler and with an optical pathway within a socket, in accordance with various embodiments.

FIG. 7 shows a diagram of a photonics die package with an optical connector to be optically coupled with the optical coupler and with an optical pathway within a socket, in accordance with various embodiments. Photonics package 700, which may be similar to photonics package 600 of FIG. 6, is positioned above a socket 770, that may be similar to socket 670 of FIG. 6. The external optical coupler 750, which may be similar to external optical coupler 650 of FIG. 6, may be integrated into the socket 770. The socket 770 may be physically and electrically coupled with the motherboard 780, which may be similar to motherboard 680 of FIG. 6.

As shown, the optical interface 716, may optically couple with the optical pathways 756, which may be similar to optical interface 616 and optical pathways 656 of FIG. 6. The optical pathways 756 may optically coupled to optical pathway 784, which may be similar to optical pathway 684 of FIG. 6. The optical pathway 784 may extend through a layer of the socket 770 to a side of the socket 771. In embodiments, the optical pathway 784 may be one or more optical fibers, one or more waveguides, or an open-air channel through which optical signals are able to be conducted.

Figure 8:
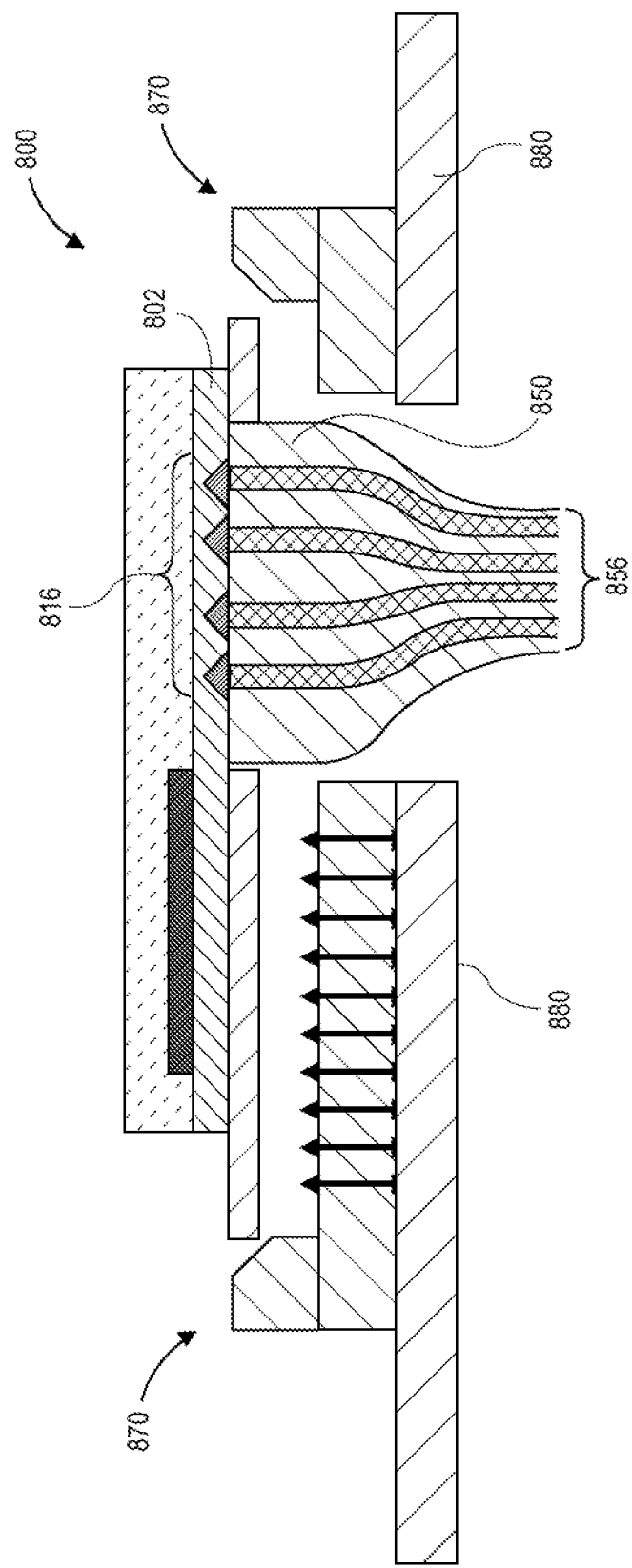
FIG. 8 shows a diagram of a photonics die package with an optical connector optically coupled and physically attached to the photonics die package, in accordance with various embodiments.

FIG. 8 shows a diagram of a photonics die package with an optical connector optically coupled and physically attached to the photonics die package, in accordance with various embodiments. Photonics package 800, which may be similar to photonics package 700 of FIG. 7, includes an optical interconnect 816, which may be similar to optical interconnect 716 of FIG. 7. An external optical coupler 850, which may be similar to external optical coupler 750 of FIG. 7, is physically and optically coupled with the optical interconnect 816.

In embodiments, there may be alignment features (not shown, but similar to alignment features 540, 542, 552, 554 of FIG. 5), disposed in the external optical coupler 850 and/or the optical interconnect 816 to enable a quality optical coupling with the optical pathways 856. In embodiments, an epoxy or other adhesive may be used to physically couple the external optical coupler 850 with the optical interconnect 816. In embodiments, the socket 870 and/or the substrate 880 may have openings as shown to allow for the attached external optical coupler 850 to properly seat in the socket 870.

Figure 9:
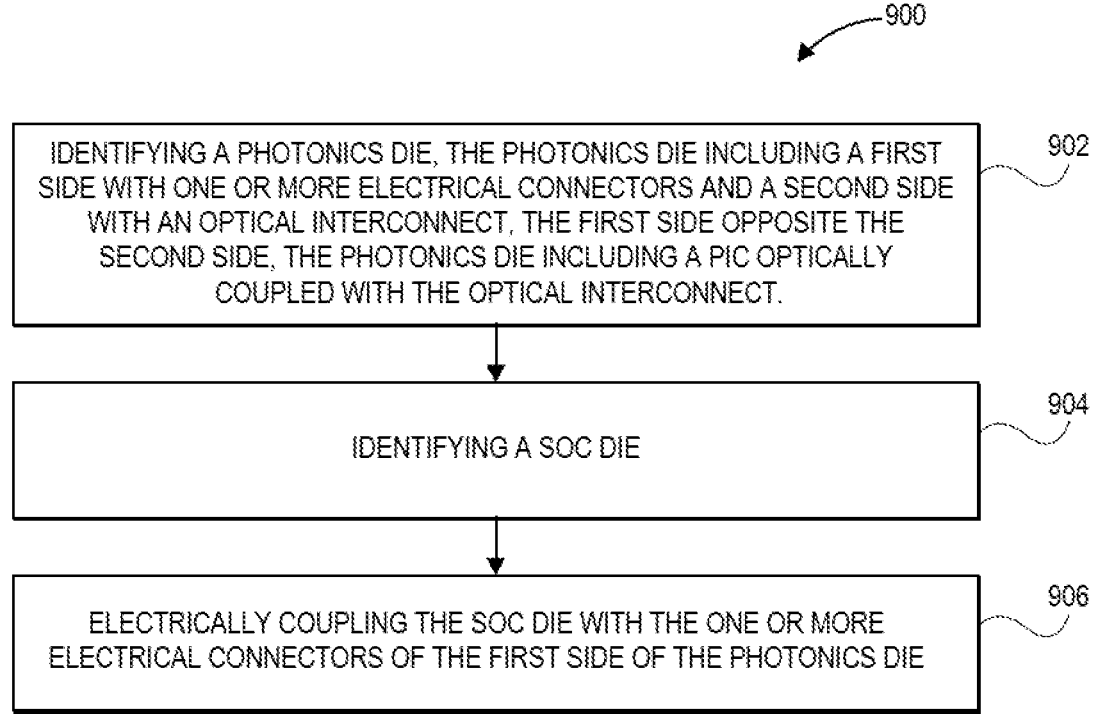
FIG. 9 is a process for manufacturing a photonics die package, in accordance with various embodiments.

FIG. 9 is a process for manufacturing a photonics die package, in accordance with various embodiments. In embodiments, process 900 may be implemented using apparatus, systems, techniques, and or processes that are described herein, and particularly with respect to FIGS. 1-8.

At block 902, the process may include identifying a photonics die, the photonics die including a first side with one or more electrical connectors and a second side with an optical interconnect, the first side opposite the second side, the photonics die including a PIC optically coupled with the optical interconnect. In embodiments, the photonics die may be at least similar to photonics die 202 of FIG. 2, 302 of FIG. 3, 402 of FIG. 4, 502 of FIG. 5, 602 of FIG. 6, or 802 of FIG. 8. The optical interconnect may be at least similar to optical interconnect 216 of FIG. 2, 316 of FIG. 3, 416 of FIG. 4, 516 of FIG. 5, 616 of FIG. 6, 716 of FIG. 7, or 816 of FIG. 8. The PIC may be incorporated within the photonics die, and may be at least similar to PIC 218 of FIG. 2 or PIC 318 of FIG. 3.

At block 904, the process may further include identifying a SOC die. In embodiments, the SOC die may be similar to at least one of die 220, 222, 224 of FIG. 2, at least one of die 420, 422, 424 of FIG. 4, or die 520 of FIG. 5. In embodiments the SOC die may be an XPU, a SOC, aCPU, a GPU, FPGA, an ASIC, an accelerator, or a silicon interposer.

At block 906, the process may further include electrically coupling the SOC die with the one or more electrical connectors of the first side of the photonics die. In embodiments, this is shown at least with respect to dies 220, 222, 224 electrically coupled with photonics die 202 of FIG. 2, dies 420, 422, 424 electrically coupled with photonics die 402 of FIG. 4, die 520 electrically coupled with photonics die 502 of FIG. 5. In embodiments the electrical coupling may be performed by solder bumps, or RDL on the first side of the photonics die.

Figure 10:
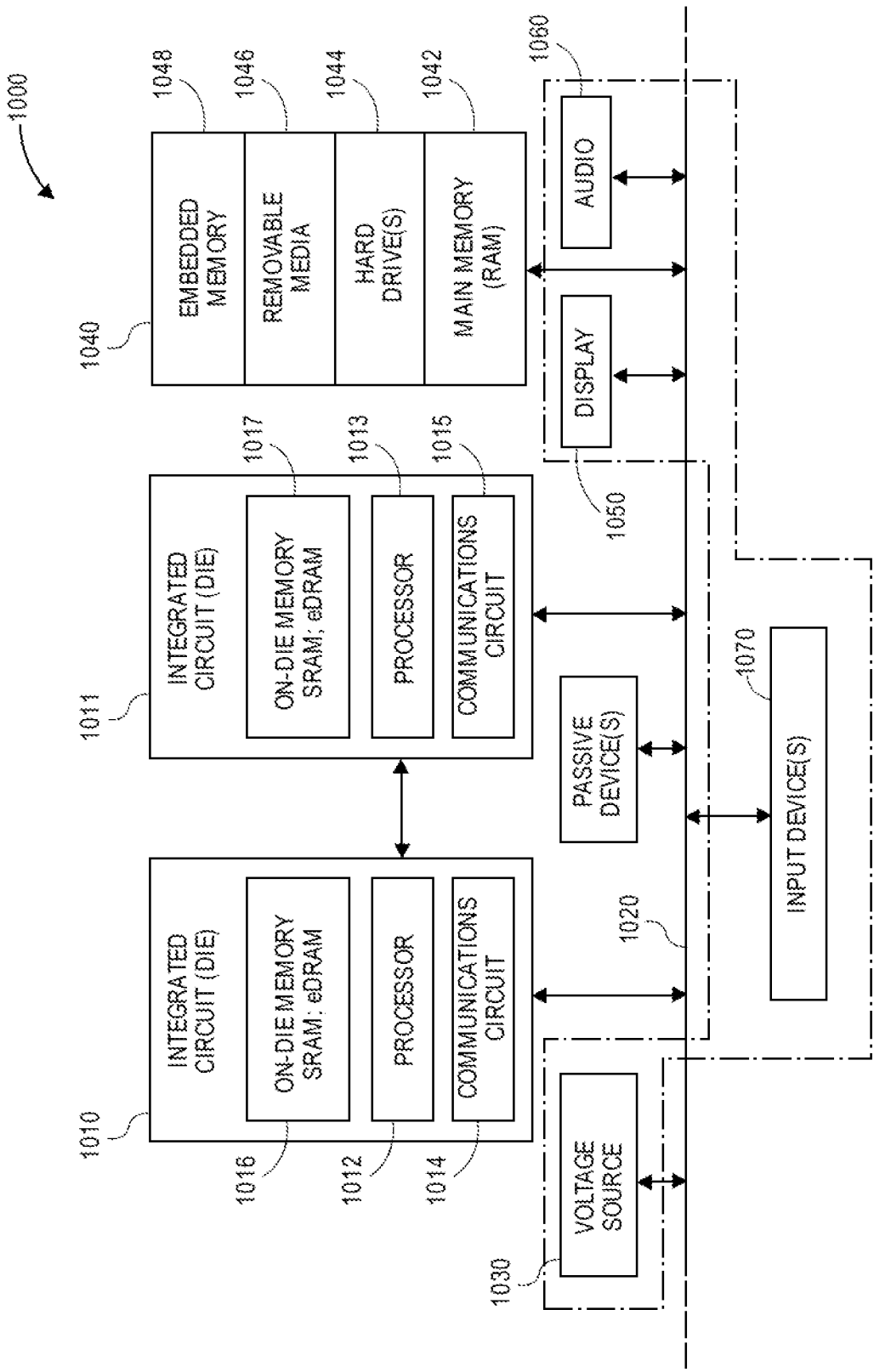
FIG. 10 is a schematic of a computer system 1000, in accordance with an embodiment of the present invention.

FIG. 10 is a schematic of a computer system 1000, in accordance with an embodiment of the present invention. The computer system 1000 (also referred to as the electronic system 1000) as depicted can embody a stackable photonics die with direct optical interconnect, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, a component that includes a stackable photonics die with direct optical interconnect, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a package substrate having a stackable photonics die with direct optical interconnect, according to any of the several disclosed embodiments and their equivalents, an electronic system, a computer system, one or more methods of fabricating an integrated circuit, and one or more methods of fabricating an electronic assembly that includes a package substrate having a stackable photonics die with direct optical interconnect, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a stackable photonics die with direct optical interconnect embodiments and their equivalents. A foundation substrate may be included, as represented by the dashed line of FIG. 10. Passive devices may also be included, as is also depicted in FIG. 10.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is a photonics die comprising: a first side of the photonics die and a second side of the photonics die opposite the first side of the photonics die; an optical interconnect at the second side of the photonics die to transmit light signals to or to receive light signals from outside the photonics die; a photonics integrated circuit (PIC) optically coupled with the optical interconnect; and one or more electrical connectors on the first side of the photonics die, wherein the one or more electrical connectors are electrically coupled with the PIC.

Example 2 may include the photonics die of example 1, further including electrical circuitry coupled with the PIC to process data based upon the received light signals.

Example 3 may include the photonics die of example 1, further including electrical circuitry to electrically couple a first location of the first side of the photonics die with the PIC.

Example 4 may include the photonics die of example 3, wherein a chip is to be disposed and electrically coupled with the first location of the first side of the photonics die.

Example 5 may include the photonics type of example 1, further including electrical circuitry to electrically couple a second location on the first side of the photonics die with a third location on the first side of the photonics die.

Example 6 may include the photonics die of example 5, wherein a first chip is to be disposed and electrically coupled with the second location on the first side of the photonics die, and wherein a second chip is to be disposed and electrically coupled with the third location on the first side of the photonics die.

Example 7 may include the photonics die of example 1, further comprising a light engine that is optically coupled with the optical interconnect.

Example 8 may include the photonics die of example 7, wherein the light engine is disposed at the first side of the photonics die.

Example 9 may include the photonics die of example 1, wherein the optical interconnect is a selected one of: a grating coupler, a lens array, or an orthogonal optical connector.

Example 10 may include the photonics die of any one of examples 1-9, further including one or more alignment features on the second side of the photonics die proximate to the optical interconnect to align an external optical coupler to the optical interface.

Example 11 is a system comprising: a photonics die comprising: a first side of the photonics die and a second side of the photonics die opposite the first side of the photonics die; an optical interconnect at the second side of the photonics die to transmit light signals to or to receive light signals from outside the photonics die; a photonics integrated circuit (PIC) optically coupled with the optical interconnect; one or more electrical connectors on the first side of the photonics die, wherein the one or more electrical connectors are electrically coupled with the PIC; and an XPU electrically coupled with the one or more electrical connectors on the first side of the photonics die.

Example 12 may include the system of example 11, wherein the XPU is a selected one of: a system on a chip (SOC), a central processing unit (CPU), a graphics processing unit (GPU), a field programmable gate array (FPGA), an application specific integrated circuit (ASIC), an accelerator, or a silicon interposer.

Example 13 may include the system of example 11, wherein the XPU is electrically coupled with another die electrically coupled to the first side of the photonics die.

Example 14 may include the system of example 11, wherein the photonics die further includes a light engine that is optically coupled with the optical interconnect.

Example 15 may include the system of example 11, further comprising a light engine coupled with the first side of the photonics die and optically coupled with the optical interconnect.

Example 16 may include the system of example 11, wherein the optical interconnect is a selected one of: a grating coupler, a lens array, or an orthogonal optical connector.

Example 17 may include the system of example 11, further comprising a substrate having a first side and a second side opposite the first side, wherein the first side of the substrate is coupled with the second side of the photonics die, wherein the substrate includes an opening proximate to the optical interconnect of the photonics die, the opening to allow light signals to pass between the optical interconnect and the second side of the substrate.

Example 18 may include the system of example 17, further comprising an optical connector inserted through the opening in the substrate and optically coupled with the optical interconnect of the photonics die.

Example 19 may include the system of example 17, wherein the optical connector includes one or more alignment features to align with one or more alignment features of the optical interconnect of the photonics die.

Example 20 may include the system of example 18, further comprising a printed circuit board physically coupled with the substrate; and wherein the printed circuit board includes a spring mechanism physically coupled with the substrate to apply pressure to the optical connector to facilitate optical coupling with the optical interconnect of the photonics die.

Example 21 may include the system of example 20, wherein the printed circuit board includes an optical path to a side of the printed circuit board; and wherein the optical connector is optically coupled with the optical path of the printed circuit board.

Example 22 may include the system of example 18, wherein the optical connector is an optical pigtail.

Example 23 may include the system of example 17, wherein the second side of the substrate is directly physically coupled with a socket.

Example 24 may include the system of example 11, wherein the one or more electrical connectors on the first side of the photonics die include a selected one of electrical bumps or a redistribution layer (RDL).

Example 25 system of any one of examples 11-24, wherein the XPU is thermally coupled with a heatsink.

Example 26 is a method comprising: identifying a photonics die, the photonics die including a first side with one or more electrical connectors and a second side with an optical interconnect, the first side opposite the second side, the photonics die including a photonics integrated circuit (PIC) optically coupled with the optical interconnect; identifying a system-on-a-chip (SOC) die; and electrically coupling the SOC die with the one or more electrical connectors of the first side of the photonics die.

Example 27 may include the method of example 26, further including coupling a second die with the first side of the photonics die.

Example 28 may include the method of example 27, wherein the second die is a light engine optically coupled with the optical interconnect of the photonics die.

Example 29 may include the method of example 26, wherein the optical interconnect includes one or more alignment features to align with an optical coupler.

Example 30 may include the method of example 29, further including coupling the optical coupler with the optical interface.

Example 31 may include the method of example 26, wherein the optical interconnect includes one or more optical channels.

Example 32 may include the method of example 29, wherein the optical coupler is an optical fiber ribbon.

What is claimed is:
1. A photonics die comprising:
  a first side of the photonics die and a second side of the photonics die opposite the first side of the photonics die;
  an optical interconnect at the second side of the photonics die to transmit light signals to or to receive light signals from outside the photonics die;
  a photonics integrated circuit (PIC) optically coupled with the optical interconnect;
  one or more electrical connectors on the first side of the photonics die, wherein the one or more electrical connectors are electrically coupled with the PIC; and electrical circuitry to electrically couple a first location on the first side of the photonics die with a second location on the first side of the photonics die, wherein a first chip is to be disposed and electrically coupled with the first location on the first side of the photonics die, and wherein a second chip is to be disposed and electrically coupled with the second location on the first side of the photonics die.

2. The photonics die of claim 1, further including electrical circuitry coupled with the PIC to process data based upon the received light signals.

3. The photonics die of claim 1, further including electrical circuitry to electrically couple a third location of the first side of the photonics die with the PIC.

4. The photonics die of claim 3, wherein a third chip is to be disposed and electrically coupled with the third location of the first side of the photonics die.

5. The photonics die of claim 1, further comprising a light engine that is optically coupled with the optical interconnect.

6. The photonics die of claim 5, wherein the light engine is disposed at the first side of the photonics die.

7. The photonics die of claim 1, wherein the optical interconnect is a selected one of: a grating coupler, a lens array, or an orthogonal optical connector.

8. photonics die of claim 1, further including one or more alignment features on the second side of the photonics die proximate to the optical interconnect to align an external optical coupler to the optical interface.

9. A system comprising:
a photonics die comprising:
a first side of the photonics die and a second side of the photonics die opposite the first side of the photonics die;
an optical interconnect at the second side of the photonics die to transmit light signals to or to receive light signals from outside the photonics die;
a photonics integrated circuit (PIC) optically coupled with the optical interconnect;
one or more electrical connectors on the first side of the photonics die, wherein
the one or more electrical connectors are electrically coupled with the PIC;
an XPU chip electrically coupled with a first location of the one or more electrical connectors on the first side of the photonics die; and
a second chip electrically coupled with a second location of the one or more electrical connectors on the first side of the photonics die.

10. The system of claim 9, wherein the XPU chip is a selected one of: a system on a chip (SOC), a central processing unit (CPU), a graphics processing unit (GPU), a field programmable gate array (FPGA), an application specific integrated circuit (ASIC), an accelerator, or a silicon interposer.

11. The system of claim 9, wherein the XPU chip is electrically coupled with the second chip.

12. The system of claim 9, wherein the photonics die further includes a light engine that is optically coupled with the optical interconnect.

13. The system of claim 9, further comprising a light engine coupled with the first side of the photonics die and optically coupled with the optical interconnect.

14. The system of claim 9, wherein the optical interconnect is a selected one of: a grating coupler, a lens array, or an orthogonal optical connector.

15. system of claim 9, further comprising a substrate having a first side and a second side opposite the first side, wherein the first side of the substrate is coupled with the second side of the photonics die, wherein the substrate includes an opening proximate to the optical interconnect of the photonics die, the opening to allow light signals to pass between the optical interconnect and the second side of the substrate.

16. The system of claim 15, further comprising an optical connector inserted through the opening in the substrate and optically coupled with the optical interconnect of the photonics die.

17. The system of claim 15, wherein the optical connector includes one or more alignment features to align with one or more alignment features of the optical interconnect of the photonics die.

18. The system of claim 16, further comprising a printed circuit board physically coupled with the substrate; and
wherein the printed circuit board includes a spring mechanism physically coupled with the substrate to apply pressure to the optical connector to facilitate optical coupling with the optical interconnect of the photonics die.

19. The system of claim 18, wherein the printed circuit board includes an optical path to a side of the printed circuit board; and wherein the optical connector is optically coupled with the optical path of the printed circuit board.

20. A method comprising:
identifying a photonics die, the photonics die including a first side with one or more electrical connectors and a second side with an optical interconnect, the first side opposite the second side, the photonics die including a photonics integrated circuit (PIC) optically coupled with the optical interconnect;
identifying a system-on-a-chip (SOC) die;
electrically coupling the SOC die with a first locations of the one or more electrical connectors of the first side of the photonics die; and
electrically coupling a second die with a second location of the one or more electrical connectors of the first side of the photonics die.

21. The method of claim 20, wherein the second die is a light engine optically coupled with the optical interconnect of the photonics die.

22. The method of claim 20, wherein the optical interconnect includes one or more alignment features to align with an optical coupler.

* * * * *